(12) United States Patent
Avoyan et al.

(10) Patent No.: US 9,396,912 B2
(45) Date of Patent: Jul. 19, 2016

(54) METHODS FOR MIXED ACID CLEANING OF SHOWERHEAD ELECTRODES

(75) Inventors: Armen Avoyan, Oakland, CA (US); Cliff La Croix, Livermore, CA (US); Hong Shih, Walnut, CA (US); John Daugherty, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 839 days.

(21) Appl. No.: 13/483,597

(22) Filed: May 30, 2012

(65) Prior Publication Data

US 2013/0104938 A1 May 2, 2013

Related U.S. Application Data

(60) Provisional application No. 61/553,404, filed on Oct. 31, 2011, provisional application No. 61/553,416, filed on Oct. 31, 2011.

(51) Int. Cl.
| | | |
|---|---|---|
| B08B 3/08 | (2006.01) | |
| B08B 9/00 | (2006.01) | |

(Continued)

(52) U.S. Cl.
CPC ............... *H01J 37/3288* (2013.01); *B08B 3/04* (2013.01); *B08B 3/08* (2013.01); *B08B 9/0323* (2013.01);

(Continued)

(58) Field of Classification Search
CPC ............ C23C 16/4407; H01J 37/32862; H01J 37/3288; H01J 37/32889; H01J 37/3244; H01L 21/0209; H01L 21/02079; B08B 9/0323; B08B 9/0321; B08B 9/0328; B08B 3/02; B08B 3/04; B08B 3/08; B08B 3/10
USPC ................ 134/22.18, 22.12, 26, 3, 30, 28, 34
See application file for complete search history.

(56) References Cited

U.S. PATENT DOCUMENTS

| | | |
|---|---|---|
| 6,073,577 A | 6/2000 | Lilleland et al. |
| 6,148,765 A | 11/2000 | Lilleland et al. |

(Continued)

FOREIGN PATENT DOCUMENTS

| | | |
|---|---|---|
| JP | 60-116766 | 6/1985 |
| TW | 200834705 A1 | 8/2008 |
| TW | 200922701 A | 6/2009 |

OTHER PUBLICATIONS

English translation of Notification of Examination Opinions issued on Jul. 16, 2014, by the Taiwanese Patent Office in corresponding Taiwanese Patent Application No. 101139984. (5 pages).

(Continued)

*Primary Examiner* — Michael Kornakov
*Assistant Examiner* — Katelyn Whatley
(74) *Attorney, Agent, or Firm* — Buchanan Ingersoll & Rooney PC

(57) ABSTRACT

In one embodiment, a method for cleaning a showerhead electrode my include sealing a showerhead electrode within a cleaning assembly such that a first cleaning volume is formed on a first side of the showerhead electrode and a second cleaning volume is formed on a second side of the showerhead electrode. An acidic solution can be loaded into the first cleaning volume on the first side of the showerhead electrode. The first cleaning volume on the first side of the showerhead electrode can be pressurized such that at least a portion of the acidic solution flows through one or more of the plurality of gas passages of the showerhead electrode. An amount of purified water can be propelled through the second cleaning volume on the second side of the showerhead electrode, and into contact with the second side of the showerhead electrode.

20 Claims, 10 Drawing Sheets

(51) Int. Cl.
*H01J 37/32* (2006.01)
*B08B 9/032* (2006.01)
*B08B 3/04* (2006.01)
*C23C 16/44* (2006.01)

(52) U.S. Cl.
CPC ......... *B08B 9/0328* (2013.01); *H01J 37/32889* (2013.01); *C23C 16/4407* (2013.01); *H01J 37/3244* (2013.01)

(56) References Cited

U.S. PATENT DOCUMENTS

| | | | |
|---|---|---|---|
| 6,194,322 B1 | 2/2001 | Lilleland et al. | |
| 6,245,192 B1 | 6/2001 | Dhindsa et al. | |
| 6,376,385 B2 | 4/2002 | Lilleland et al. | |
| 6,506,254 B1 | 1/2003 | Bosch et al. | |
| 6,648,982 B1 * | 11/2003 | Zuck et al. | 134/30 |
| 6,673,198 B1 | 1/2004 | Wicker | |
| 6,805,952 B2 | 10/2004 | Chang et al. | |
| 6,846,726 B2 | 1/2005 | Ren et al. | |
| 6,881,608 B2 | 4/2005 | Wicker | |
| 6,890,861 B1 | 5/2005 | Bosch | |
| 7,247,579 B2 | 7/2007 | Ren et al. | |
| 7,442,114 B2 | 10/2008 | Huang et al. | |
| 7,464,717 B2 | 12/2008 | Zhao et al. | |
| 7,498,269 B2 | 3/2009 | Ren et al. | |
| 7,507,670 B2 | 3/2009 | Shih et al. | |
| 7,517,803 B2 | 4/2009 | Ren et al. | |
| 7,578,889 B2 | 8/2009 | Shih et al. | |
| 7,662,723 B2 | 2/2010 | Hwang et al. | |
| 7,767,028 B2 | 8/2010 | Augustino et al. | |
| 7,802,539 B2 | 9/2010 | Bosch | |
| 7,942,973 B2 | 5/2011 | Shih et al. | |
| 8,043,434 B2 | 10/2011 | Chebi et al. | |
| 8,075,701 B2 | 12/2011 | Avoyan et al. | |
| 8,128,750 B2 | 3/2012 | Kenworthy et al. | |
| 8,143,161 B2 | 3/2012 | Ivanov | |
| 8,171,877 B2 | 5/2012 | Augustino et al. | |
| 8,215,321 B2 | 7/2012 | Shih et al. | |
| 8,221,552 B2 | 7/2012 | Outka et al. | |
| 2004/0224128 A1 | 11/2004 | Chang et al. | |
| 2005/0145176 A1 | 7/2005 | Wicker | |
| 2005/0217695 A1 * | 10/2005 | Zuck | 134/2 |
| 2005/0241765 A1 | 11/2005 | Dhindsa et al. | |
| 2005/0274396 A1 * | 12/2005 | Shih et al. | 134/29 |
| 2007/0068629 A1 | 3/2007 | Shih et al. | |
| 2007/0235660 A1 | 10/2007 | Hudson | |
| 2007/0284246 A1 | 12/2007 | Keil et al. | |
| 2008/0026589 A1 | 1/2008 | Hubacek et al. | |
| 2008/0092920 A1 * | 4/2008 | Shih et al. | 134/1 |
| 2008/0236620 A1 * | 10/2008 | Shih et al. | 134/9 |
| 2008/0271749 A1 | 11/2008 | Freer et al. | |
| 2009/0321018 A1 | 12/2009 | Augustino et al. | |
| 2010/0055300 A1 | 3/2010 | Ivanov | |
| 2011/0146704 A1 | 6/2011 | Shih et al. | |
| 2011/0259519 A1 | 10/2011 | Kenworthy et al. | |
| 2012/0006486 A1 | 1/2012 | Chebi et al. | |
| 2012/0132532 A1 | 5/2012 | Kenworthy et al. | |

OTHER PUBLICATIONS

Official Action issued Jul. 16, 2014 for Taiwan Patent Appln. No. 101139984.

Official Action issued Jul. 17, 2014 for Taiwan Patent Appln. No. 101140158.

* cited by examiner

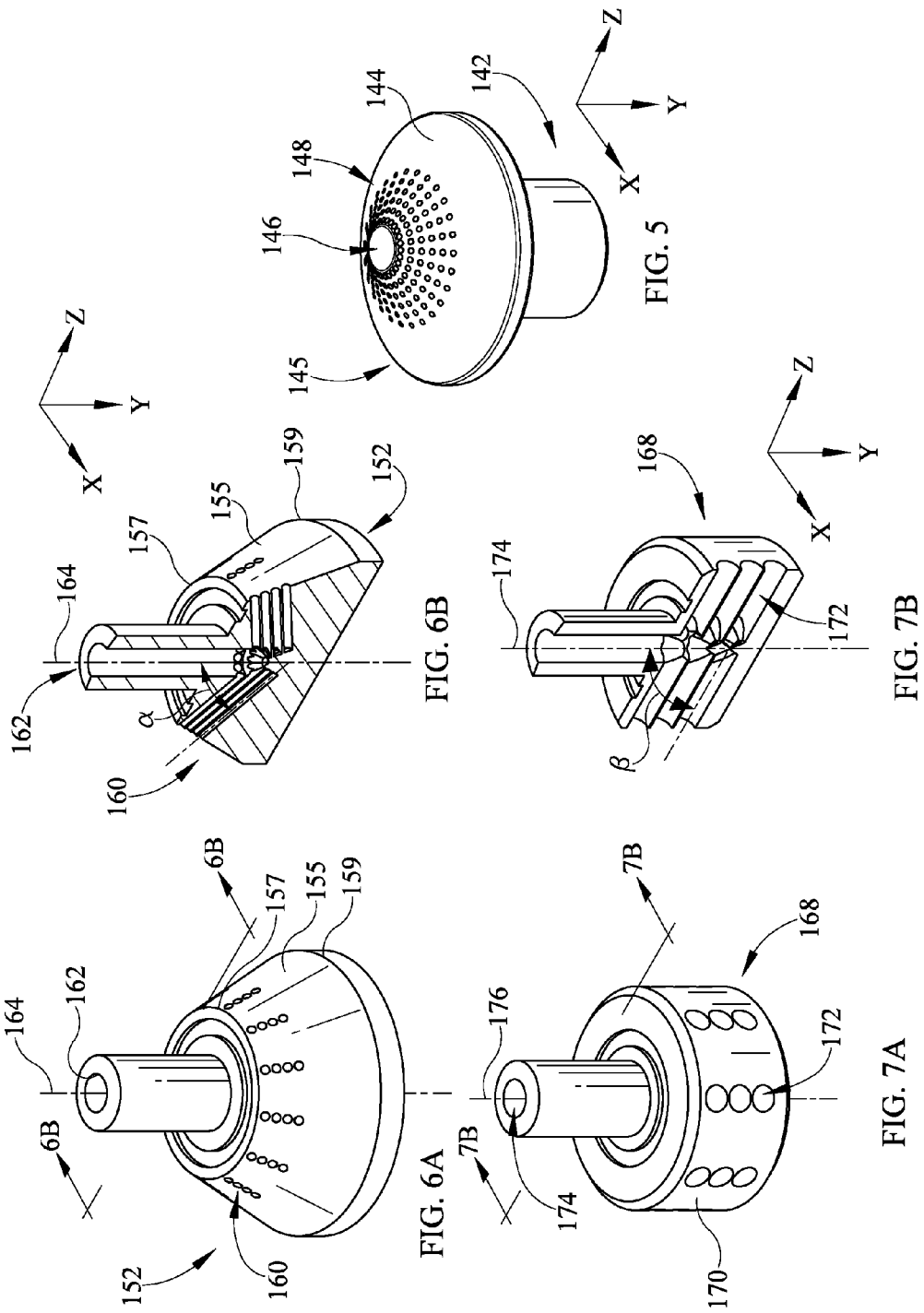

METHODS FOR MIXED ACID CLEANING OF SHOWERHEAD ELECTRODES

CROSS-REFERENCE TO RELATED APPLICATIONS

This application claims the benefit of U.S. Provisional Application No. 61/553,404 filed Oct. 31, 2011, entitled "FORCED-FLOW ELECTRODE ETCH USING PNEUMATIC CYLINDER IN HORIZONTAL POSITION FOR SEALING," and U.S. Provisional Application No. 61/553,416 filed Oct. 31, 2011, entitled "FORCED-FLOW ELECTRODE ETCH USING PNEUMATIC CYLINDER IN VERTICAL POSITION FOR SEALING."

This application is related to U.S. application Ser. No. 13/483,566 filed May 30, 2012 entitled "MIXED ACID CLEANING ASSEMBLIES," which has now been patented and published as U.S. Pat. No. 9,293,305.

TECHNICAL FIELD

The present specification generally relates to mixed acid cleaning assemblies, more specifically, to mixed acid cleaning assemblies for cleaning showerhead electrodes.

BACKGROUND

The present disclosure relates generally to mixed acid assemblies for cleaning the gas passages of showerhead electrodes that are used as excitation electrodes in plasma processing systems. Although the context of the present disclosure is not limited to particular types of showerhead electrodes or the context in which the showerhead electrodes to be cleaned have been used, for the purposes of illustration, the mixed acid assemblies are illustrated herein with reference to a mono silicon-based electrode having a disc-shape with concentrically arranged gas passages. Those practicing the embodiments described herein will find that some of the mixed acid assemblies proposed herein will enjoy favorable utility in the context of a variety of types of electrodes and non-electrodes.

FIG. 1 illustrates a mixed acid assembly coupled to a showerhead electrode having a disc-shape. FIG. 3 illustrates a showerhead electrode in an exploded view. Further teachings regarding the structure of showerhead electrodes and electrode assemblies similar to that illustrated in FIGS. 1 and 3 can be found in US Pub. Nos. 2007/0068629, 2007/0235660, and 2007/0284246, pertinent portions of which are incorporated herein by reference. Additional related teachings can be found in U.S. Pat. Nos. 6,073,577, 6,148,765, 6,194,322, 6,245,192, and 6,376,385, and US Pub. No. 2005/0241765.

SUMMARY

In one embodiment, a method for cleaning a showerhead electrode my include sealing a showerhead electrode within a cleaning assembly such that a first cleaning volume is formed on a first side of the showerhead electrode and a second cleaning volume is formed on a second side of the showerhead electrode. The showerhead electrode may include a plurality of gas passages that extend through the showerhead electrode from the first side of the showerhead electrode to the second side of the showerhead electrode. An acidic solution can be loaded into the first cleaning volume on the first side of the showerhead electrode. The first cleaning volume on the first side of the showerhead electrode can be pressurized such that at least a portion of the acidic solution flows through one or more of the plurality of gas passages of the showerhead electrode. An amount of purified water can be propelled through the second cleaning volume on the second side of the showerhead electrode, and into contact with the second side of the showerhead electrode.

In another embodiment, a method for cleaning a showerhead electrode may include sealing a showerhead electrode within a cleaning assembly such that a first cleaning volume is formed on a first side of the showerhead electrode and a second cleaning volume is formed on a second side of the showerhead electrode. The showerhead electrode may include a plurality of gas passages that extend through the showerhead electrode from the first side of the showerhead electrode to the second side of the showerhead electrode. An acidic solution can be loaded into the first cleaning volume on the first side of the showerhead electrode. The first cleaning volume on the first side of the showerhead electrode can be pressurized with a gas supplied with a gas dispersion member. At least a portion of the acidic solution can flow through one or more of the plurality of gas passages of the showerhead electrode. The gas dispersion member may include a chamfered body having a substantially trapezoidally shaped cross-section and a plurality of gas outlets formed in the chamfered body. A quantity of purified water can be propelled through the first cleaning volume on the first side of the showerhead electrode and into contact with the first side of the showerhead electrode with a liquid dispersion member. The liquid dispersion member can include a cylindrical body with a central flow path formed therein, and a plurality of liquid outlets formed in the cylindrical body. Each of the plurality of liquid outlets can be a substantially linear conduit that travels radially outward from the central flow path. An amount of purified water can be propelled through the second cleaning volume on the second side of the showerhead electrode, and into contact with the second side of the showerhead electrode with a conoidal spray member. The conoidal spray member may include a cone shaped member having a base that is relatively large compared to a peak of the cone shaped member, and a plurality of apertures formed through the cone shaped member and arranged in a plurality of concentric rings.

BRIEF DESCRIPTION OF THE DRAWINGS

The following detailed description of specific embodiments of the present disclosure can be best understood when read in conjunction with the following drawings, where like structure is indicated with like reference numerals and in which:

FIG. 5 schematically depicts a conoidal spray member according to one or more embodiments shown and described herein;

FIGS. 6A-6B schematically depict a gas dispersion member according to one or more embodiments shown and described herein;

FIGS. 7A-7B schematically depict a liquid dispersion member according to one or more embodiments shown and described herein;

DETAILED DESCRIPTION

As is noted above, the present disclosure relates to a cleaning assembly which may be utilized to clean after initial manufacture and/or refurbish electrodes such as, but not limited to, silicon-based electrodes. The concepts of the present disclosure should not be limited to particular electrodes or electrode assembly configurations. Thus, electrodes, inner and outer electrodes of multi-component electrode assemblies may be cleaned or refurbished with the embodiments described herein. Moreover, electrodes with backing plates adhered to a silicon based portion of the electrode may be cleaned or refurbished as described herein.

Figure 1:
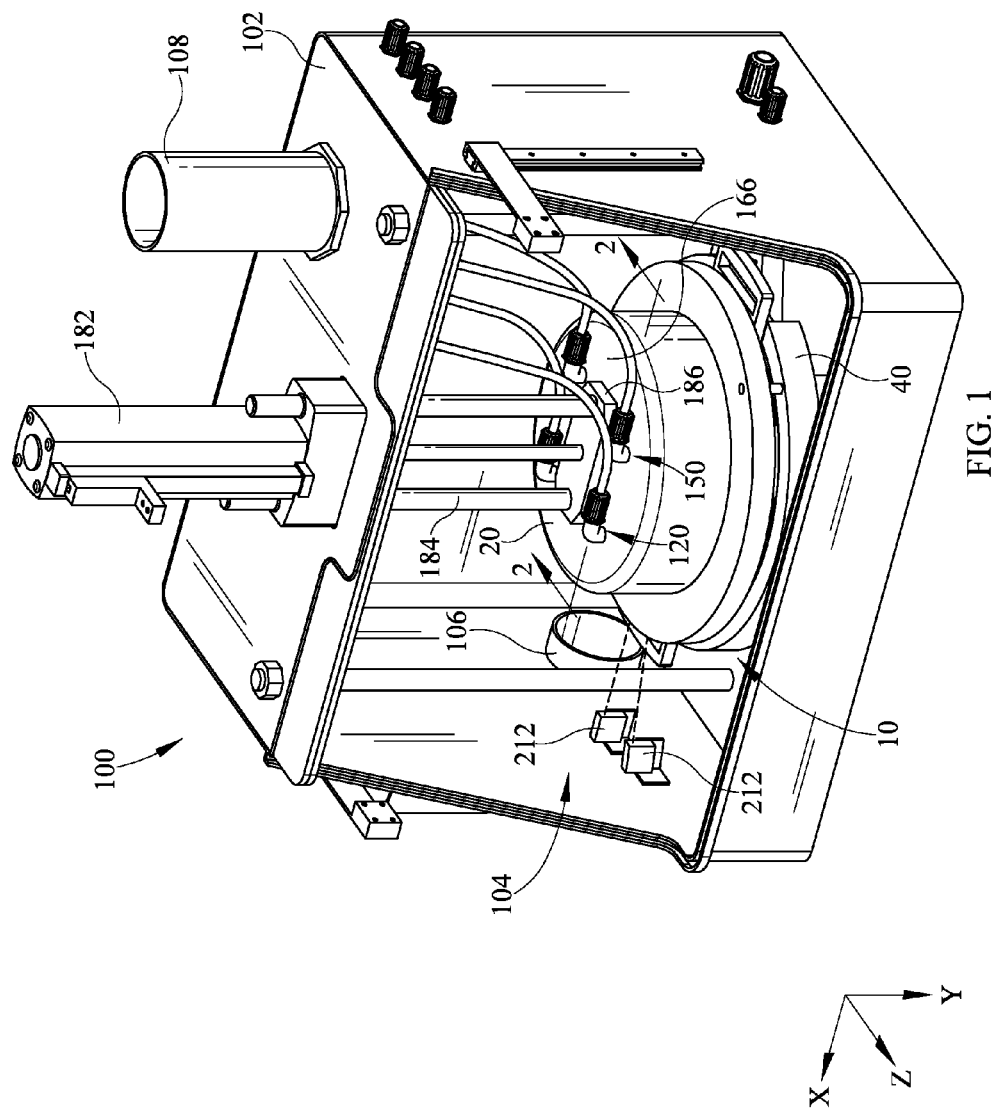
FIG. 1 schematically depicts a mixed acid cleaning assembly according to one or more embodiments shown and described herein.

Referring to FIG. 1, a cleaning assembly 100 comprises a modular electrode sealing housing 10 for at least partially enclosing a showerhead electrode 110. The modular electrode sealing housing 10 can be located within a sealable chamber 102 that defines an interior volume 104 that surrounds the modular electrode sealing housing 10. The ambient conditions of the interior volume 104 of the sealable chamber 102 can be isolated such that any gases that escape from the modular electrode sealing housing 10 during normal operation. Specifically, the sealable chamber 102 can be in fluid communication with an air inlet 106 that supplies air that is substantially free of caustic gases and an air outlet 108 that is operable to remove any gases that escape from the modular electrode sealing housing 10. It is noted that the phrase "fluid communication," as used herein, means the exchange of fluid from one object to another object, which may include, for example, the flow of compressible and incompressible fluids.

Figure 2:
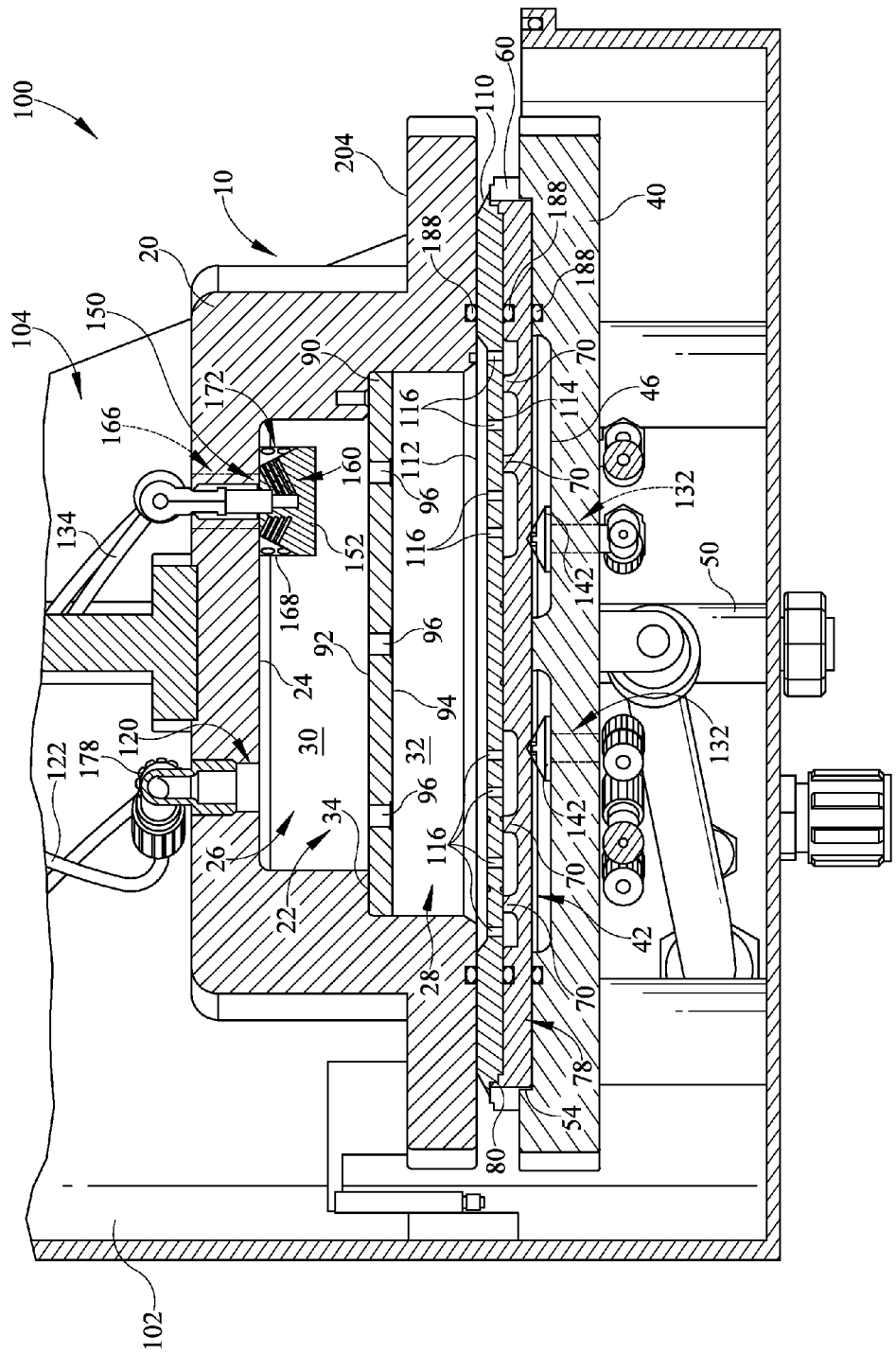
FIG. 2 schematically depicts a cross-section of a mixed acid cleaning assembly according to one or more embodiments shown and described herein.

Referring now to FIG. 2, the modular electrode sealing housing 10 comprises a high pressure closure member 20 that contains a first cleaning volume 22. Specifically, the first cleaning volume 22 can be a bore formed in the high pressure closure member 20. The first cleaning volume 22 can be delimited by a depth defining wall 24 formed within the high pressure closure member 20. In some embodiments, the first cleaning volume 22 can include multiple sections that each has a different outer boundary. Specifically, the first cleaning volume 22 can include a first section 26 and a second section 28. The first section 26 of the first cleaning volume 22 can be delimited by a first outer wall 30. Similarly, the second section 28 of the first cleaning volume 22 can be delimited by a second outer wall 32. In the embodiment depicted in FIG. 2, each of the first section 26 and the second section 28 can enclose a different quantity of space. Specifically, the first section 26 can enclose a relatively small amount of space compared to the second section 28. Accordingly, a overlap defining wall 34 can be formed in the transition between the first outer wall 30 and the second outer wall 32 that are formed in the high pressure closure member 20. It is noted that, while the first section 26 and the second section 28 of the first cleaning volume 22 are depicted as being substantially cylindrical, can be the first section 26 and the second section 28 of the first cleaning volume 22 can be any shape that is suitable to correspond with the portion of the showerhead electrode 110 that is desired to be cleaned.

Figure 3:
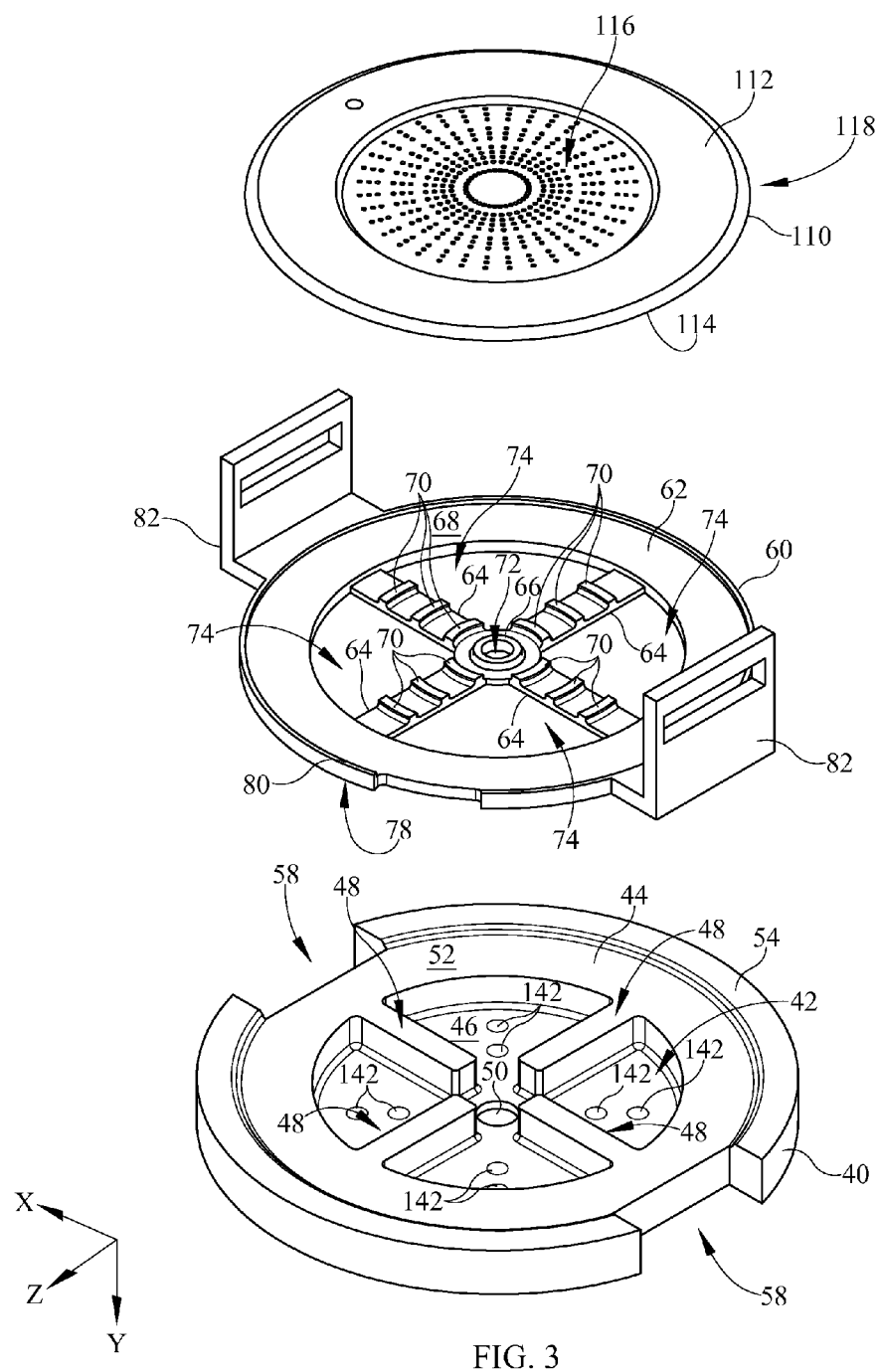
FIG. 3 schematically depicts an exploded view of a mixed acid assembly according to one or more embodiments shown and described herein.

Referring now to FIG. 3, the showerhead electrode 110 is commonly utilized to process substrates in a plasma processing device. The showerhead electrode 110 can be a single-piece, circular showerhead or a portion of a multi-component, circular showerhead which can include a circular central electrode and one or more peripheral electrodes arranged about the circumference of the central electrode. The showerhead electrode 110 comprises a first side 112 and a second side 114 with a plurality of gas passages 116 that are formed through the showerhead electrode 110 and travel from the first side 112 to the second side 114. The showerhead electrode can be formed from material comprising or consisting of silicon (e.g., single crystal silicon or polysilicon), silicon nitride, silicon carbide, boron carbide, aluminum nitride, aluminum oxide, or combinations thereof.

The modular electrode sealing housing 10 comprises a low pressure closure member 40 that contains a second cleaning volume 42. Specifically, the low pressure closure member 40 forms at least a portion of the outer boundary of the second cleaning volume 42. In some embodiments, the low pressure closure member 40 can comprise a peripheral support region 44, a fluid collecting surface 46, and one or more protruding support members 48 that cooperate to form at least a portion of the outer boundary of the second cleaning volume 42.

The peripheral support region 44 is formed around the fluid collecting surface 46 and the one or more protruding support members 48. The low pressure closure member 40 can be formed such that the peripheral support region 44 is raised with respect to the fluid collecting surface 46. Thus, the fluid collecting surface 46 can be indented with respect to the peripheral support region 44. In some embodiments, an outlet passage 50 can be in fluid communication with the second cleaning volume 42. In further embodiments, outlet passage 50 can be formed through the fluid collecting surface 46 of the low pressure closure member 40 such that the outlet passage 50 is substantially centered along the fluid collecting surface 46.

The one or more protruding support members 48 can project away from the fluid collecting surface 46 such that the one or more protruding support members 48 are raised with respect to the fluid collecting surface 46 (e.g., offset with respect to the Y-axis). Thus, the one or more protruding support members 48 and the peripheral support region 44 can cooperate to define a sunken region formed into the low pressure closure member 40. Accordingly, a portion of the second cleaning volume 42 can be defined by the sunken region bounded by the peripheral support region 44, the fluid collecting surface 46, and the one or more protruding support members 48 of the low pressure closure member 40. Thus, the second cleaning volume 42 can be configured to operate as a basin that collects fluid during the cleaning process for removal via the outlet passage 50.

In some embodiments, each of the one or more protruding support members 48 can extend from the peripheral support region 44 towards the center of the low pressure closure member 40. Specifically, the embodiment depicted in FIG. 3, includes four of the one or more protruding support members 48 arranged such that each of the one or more protruding support members 48 form a branch in a substantially "X" shaped pattern. The peripheral support region 44 and the one or more protruding support members 48 can form an upper support surface 52. The upper support surface 52 can be a substantially planar surface (e.g., depicted as an X-Z plane in FIG. 3) that is configured to resist deflection such as along the Y-direction. It is noted that, while the one or more protruding support members 48 are depicted in FIG. 3 as being substantially linear extrusions, the one or more protruding support members 48 can be any shape suitable to support a showerhead electrode 110 during operation of the cleaning assembly 100 such as, but not limited to, substantially arcuate members. Moreover, the embodiments described herein can include any number of the one or more protruding support members 48 suitable to support a showerhead electrode 110 during operation of the cleaning assembly 100.

Referring still to FIG. 3, the modular electrode sealing housing 10 can comprise an electrode carrier plate 60 that is configured to support the showerhead electrode 110 while in contact with the low pressure closure member 40. The electrode carrier plate 60 comprises a peripheral electrode contacting portion 62, one or more horizontal support members 64, and an annular electrode contacting ridge 66. The peripheral electrode contacting portion 62 can be formed around the one or more horizontal support members 64 and the annular electrode contacting ridge 66. Specifically, in the embodiment depicted in FIG. 3, the peripheral electrode contacting portion 62 is substantially annular shaped section that forms a support surface 68 that is configured to contact a corresponding portion of the showerhead electrode 110.

Each of the one or more horizontal support members 64 extends from the annular electrode contacting ridge 66 to the peripheral electrode contacting portion 62. For example, the one or more horizontal support members 64 can provide a structural link that supports the annular electrode contacting ridge 66. Each of the one or more horizontal support members 64 is indented with respect to the peripheral electrode contacting portion 62. Specifically, each of the one or more horizontal support members 64 form a relief with respect to the support surface 68 of the peripheral electrode contacting portion 62 along the Y-axis. Each of the one or more horizontal support members 64 can be coupled to an arcuate electrode contacting ridge 70 that projects away from the one or more horizontal support members 64. In some embodiments, the arcuate electrode contacting ridge 70 can extend away from the one or more horizontal support members 64 such that the arcuate electrode contacting ridge 70 has a portion that is on plane with the support surface 68 of the peripheral electrode contacting portion 62 (depicted in FIG. 3 as an X-Z plane).

In some embodiments, the annular electrode contacting ridge 66 can be formed around a central orifice 72. Alternatively or additionally, the peripheral electrode contacting portion 62 and the one or more horizontal support members 64 can demarcate one or more cut-out regions 74 in the electrode carrier plate 60. For example, the electrode carrier plate 60 can be substantially disc shaped and each of the one or more cut-out regions 74 in the electrode carrier plate 60 can be substantially pie shaped. Accordingly, the central orifice 72 can be a substantially cylindrical orifice formed near the center of the electrode carrier plate 60. The annular electrode contacting ridge 66 can form at least a portion of the central orifice and be concentric with the central orifice 72. Moreover, each arcuate electrode contacting ridge 70 can be concentric with the central orifice 72.

Referring again to FIG. 2, the cleaning assembly 100 further comprises an acid injection inlet 120 for supplying an acidic solution to the showerhead electrode 110. The acid injection inlet 120 can be coupled to the high pressure closure member 20 and in fluid communication with the first cleaning volume 22 of the high pressure closure member 20. Accordingly, the acid injection inlet 120 can be operable to supply an acidic solution to the first cleaning volume 22 of the high pressure closure member 20.

Figure 4:
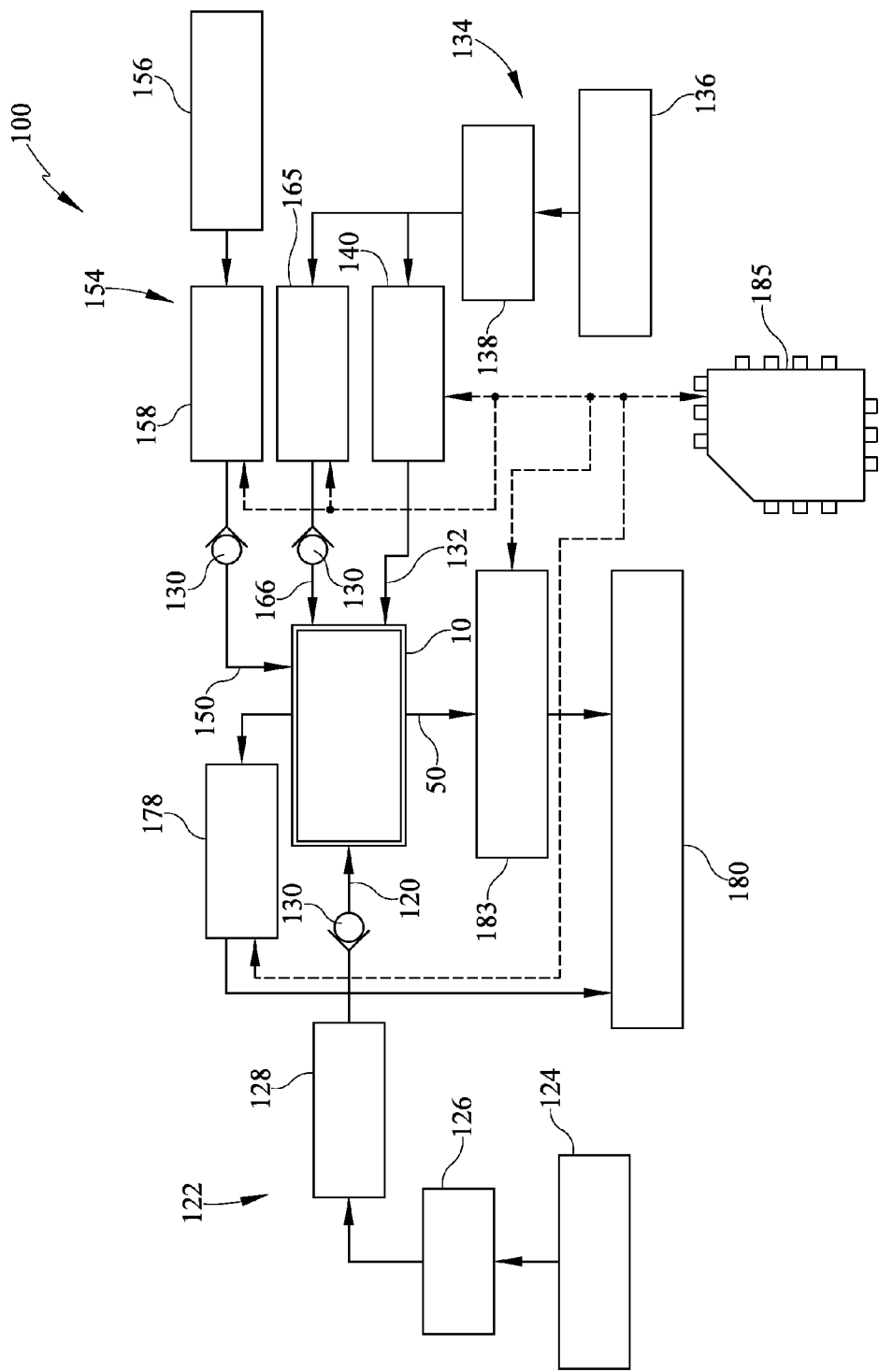
FIG. 4 schematically depicts a mixed acid cleaning assembly according to one or more embodiments shown and described herein.

Referring now to FIG. 4, an embodiment of the modular electrode sealing housing 10 is schematically depicted. In the depicted embodiment, the acid injection inlet 120 can be in fluid communication with an acid supply assembly 122. The acid supply assembly 122 can include an acid supply 124 that is operably connected to a pump 126. The pump 126 is configured to deliver the acidic solution from the acid supply 124 to the acid injection inlet 120. The acid supply 124 can include one or more vessels for storing acidic solutions. According to the embodiments described herein, the acidic solution can comprise nitric acid, hydrofluoric acid, acetic acid, or combinations thereof. In one embodiment, the acidic solution is a mixed acid solution comprising nitric acid, hydrofluoric acid, and acetic acid. In a further embodiment, the mixed acid solution can comprise a volume ratio of about 6 units of nitric acid to about 1 unit of hydrofluoric acid to about 1 unit of acetic acid (i.e., a volume ratio of about 6 to about 1 to about 1). In still a further embodiment, the mixed acid solution can comprise water a weight percent of greater than about 20%, such as, for example greater than or equal to about 30% in one embodiment.

The acid supply assembly 122 can further include a solenoid valve 128 configured to selectively open and close such that the acidic solution can be selectively delivered to the modular electrode sealing housing 10. The acid supply assembly 122 can further include a check valve 130 that is configured to allow fluid flow towards the modular electrode sealing housing 10 and substantially prevent fluid flow from the cleaning assembly 100. It is noted that the phrase "solenoid valve" as us used herein means an electromechanical valve that can be controlled by an electrical signal supplied via, for example, a controller.

Referring again to FIG. 2, the modular electrode sealing housing 10 further comprises a fluid injection inlet 132 for supplying purified water to the showerhead electrode 110. The fluid injection inlet 132 can be coupled to the low pressure closure member 40 and in fluid communication with the second cleaning volume 42 of the low pressure closure member 40. Accordingly, the fluid injection inlet 132 can be operable to supply purified water to the second cleaning volume 42 of the low pressure closure member 40.

Referring again to FIG. 4, the fluid injection inlet 132 can be in fluid communication with a water supply assembly 134. The water supply assembly 134 can include a water supply 136 that is operably connected to a pump 138. The pump 138 is configured to deliver purified water from the water supply 136 to the fluid injection inlet 132. The water supply 136 can be any system or device suitable to store or deliver a sufficient quantity of purified water such as, for example, storage tank or a water purification system. In some embodiments, the purified water can be deionized water (DIW), which is water that has had mineral ions removed such as, but not limited to, cations from sodium, calcium, iron, copper and anions such as chloride and bromide. The water supply assembly 134 can further include a solenoid valve 140 configured to selectively open and close such that the purified water can be selectively delivered to the second cleaning volume 42 of the low pressure closure member 40 (FIG. 2).

Referring collectively to FIGS. 2 and 5, the fluid injection inlet 132 can be in fluid communication with a conoidal spray member 142 for directing the flow of purified water in the second cleaning volume 42. For example, the conoidal spray member 142 can be configured to generate a spray that covers a relatively large area with respect to the surface are of the conoidal spray member 142 exposed to the second cleaning volume 42. In one embodiment, the conoidal spray member 142 substantially cone shaped member 144 that has a base 145 that is relatively large compared to a peak 146 of the cone shaped member 144. The cone shaped member 144 can taper from the base 145 towards the peak 146. The conoidal spray member 142 can further include a plurality of apertures 148 arranged in a plurality of concentric rings. The concentric rings can be centered with the peak 146 of the cone shaped member 144. In some embodiments, the number of the plurality of apertures 148 in each ring increases as the distance away from the peak increases, i.e., a ring nearer the base 145 can have a larger quantity of the plurality of apertures 148 than a ring nearer the peak 146.

Referring again to FIG. 2, the cleaning assembly 100 can further comprise a gas injection inlet 150 for supplying air to the showerhead electrode 110. Specifically, the gas injection inlet 150 can be formed in the high pressure closure member 20 and in fluid communication with the first cleaning volume 22 of the high pressure closure member 20. In one embodiment, the gas injection inlet 150 can supply clean dry air to the first cleaning volume 22 of the high pressure closure member 20.

Referring again to FIG. 4, the gas injection inlet 150 can be in fluid communication with a gas supply assembly 154. The gas supply assembly 154 can include a gas supply 156 that is in fluid communication with a solenoid valve 158. The gas supply 156 can include one or more vessels and/or a device for providing pressurized gas. The solenoid valve 158 is configured to selectively open and close such that the gas (e.g., air or CDA) can be selectively delivered to the first cleaning volume 22 of the high pressure closure member 20 (FIG. 2). The gas supply assembly 154 can further include a check valve 130 that is configured to allow fluid flow towards the modular electrode sealing housing 10 and substantially prevent fluid flow from the modular electrode sealing housing 10.

Referring collectively to FIGS. 2, 6A and 6B, the gas injection inlet 150 can be in fluid communication with a gas dispersion member 152 for directing the flow of gas in the first cleaning volume 22. For example, the gas dispersion member 152 can be configured to diffuse a pressurized gas into the first cleaning volume 22 such that the pressurized gas is indirectly fed to the showerhead electrode 110. In one embodiment, the gas dispersion member 152 comprises a chamfered body 155 that has substantially chamfered cylindrical shape or a substantially trapezoidally shaped cross-section. Accordingly, the chamfered body 155 can comprise a first perimeter 157 that is relatively small compared to a second perimeter 159. The chamfer body can taper inwards the second perimeter 159 towards the first perimeter 157. The gas dispersion member 152 can further include a plurality of gas outlets 160 in fluid communication with a central flow path 162. The plurality of gas outlets 160 are conduits formed through the chamfered body 155 of the gas dispersion member 152 and arranged in a plurality of concentric rings. The concentric rings can be centered with the center line 164 of the central flow path 162. In some embodiments, each of the plurality of gas outlets 160 is a substantially linear conduit that is oriented at an acute angle $\alpha$ with respect to the center line 164 of the central flow path 162. In one embodiment, the acute angle $\alpha$ is from about 25° (about 0.44 radians) to about 50° (about 0.87 radians).

Referring again to FIG. 2, the modular electrode sealing housing 10 can further comprise a second fluid injection inlet 166 for supplying purified water to the showerhead electrode 110. Specifically, the second fluid injection inlet 166 can be formed in the high pressure closure member 20 and in fluid communication with the first cleaning volume 22 of the high pressure closure member 20. In one embodiment, the second fluid injection inlet 166 can supply deionized water to the first cleaning volume 22 of the high pressure closure member 20.

Referring again to FIG. 4, the second fluid injection inlet 166 can be in fluid communication with the water supply assembly 134. The water supply assembly 134 can further include a solenoid valve 165 that is in fluid communication with the pump 138 The solenoid valve 165 is configured to selectively open and close such that the purified water can be selectively delivered to the first cleaning volume 22 of the high pressure closure member 20 (FIG. 2). It is noted that, while the water supply assembly 134 is depicted in FIG. 4 as supplying purified water to the fluid injection inlet 132 and the second fluid injection inlet 166, each of the fluid injection inlet 132 and the second fluid injection inlet 166 can have their own independent source of water.

Referring collectively to FIGS. 2, 7A and 7B, the second fluid injection inlet 166 can be in fluid communication with a liquid dispersion member 168 for directing the flow of liquid in the first cleaning volume 22. For example, the liquid dispersion member 168 can be configured to diffuse liquid into the first cleaning volume 22 such that the liquid is indirectly fed to the showerhead electrode 110. In one embodiment, the liquid dispersion member 168 comprises a cylindrical body 170 that has a substantially cylindrical shape. The liquid dispersion member 168 can further include a plurality of liquid outlets 172 in fluid communication with a central flow path 174. The plurality of liquid outlets 172 are conduits formed through the cylindrical body 170 of the liquid dispersion member 168. Each of the plurality of liquid outlets 172 can be a substantially linear conduit that travels radially outward from the central flow path 174 of the liquid dispersion member 168. In some embodiments, each of the plurality of gas outlets 160 is a substantially linear conduit that is oriented at a flat angle $\beta$ with respect to the center line 176 of the central flow path 174. The flat angle $\beta$ can be any angle with a substantial radial component such as, for example, from about 75° (about 1.31 radians) to about 105° (about 1.83 radians).

Referring again to FIG. 4, the cleaning assembly 100 can further comprise a pressure exhaust 178 coupled to the high pressure closure member 20 and in fluid communication with the first cleaning volume 22 of the high pressure closure member 20. The pressure exhaust 178 can be in fluid communication with a storage vessel 180 for containing any fluids that are released vie the pressure exhaust 178. The pressure exhaust 178 can be a valve configured to release pressure from the first cleaning volume 22. The pressure exhaust 178 can be opened once a threshold pressure has been achieved in the first cleaning volume 22 (e.g., a pressure relief valve), or the pressure exhaust 178 can be opened via an electrical signal (e.g., a solenoid valve). In some embodiments, the pressure exhaust 178 may include both a pressure relief valve and a solenoid valve. In further embodiments, the outlet passage 50 of the low pressure closure member 40 (FIG. 2) can be in fluid communication with a solenoid valve 183. The solenoid valve 183 can be in fluid communication with the storage vessel 180. The solenoid valve 183 is configured to selectively open and close such that fluid can be selectively removed from the second cleaning volume 42 of the low pressure closure member 40 (FIG. 2) and delivered to the storage vessel 180.

Figure 8:
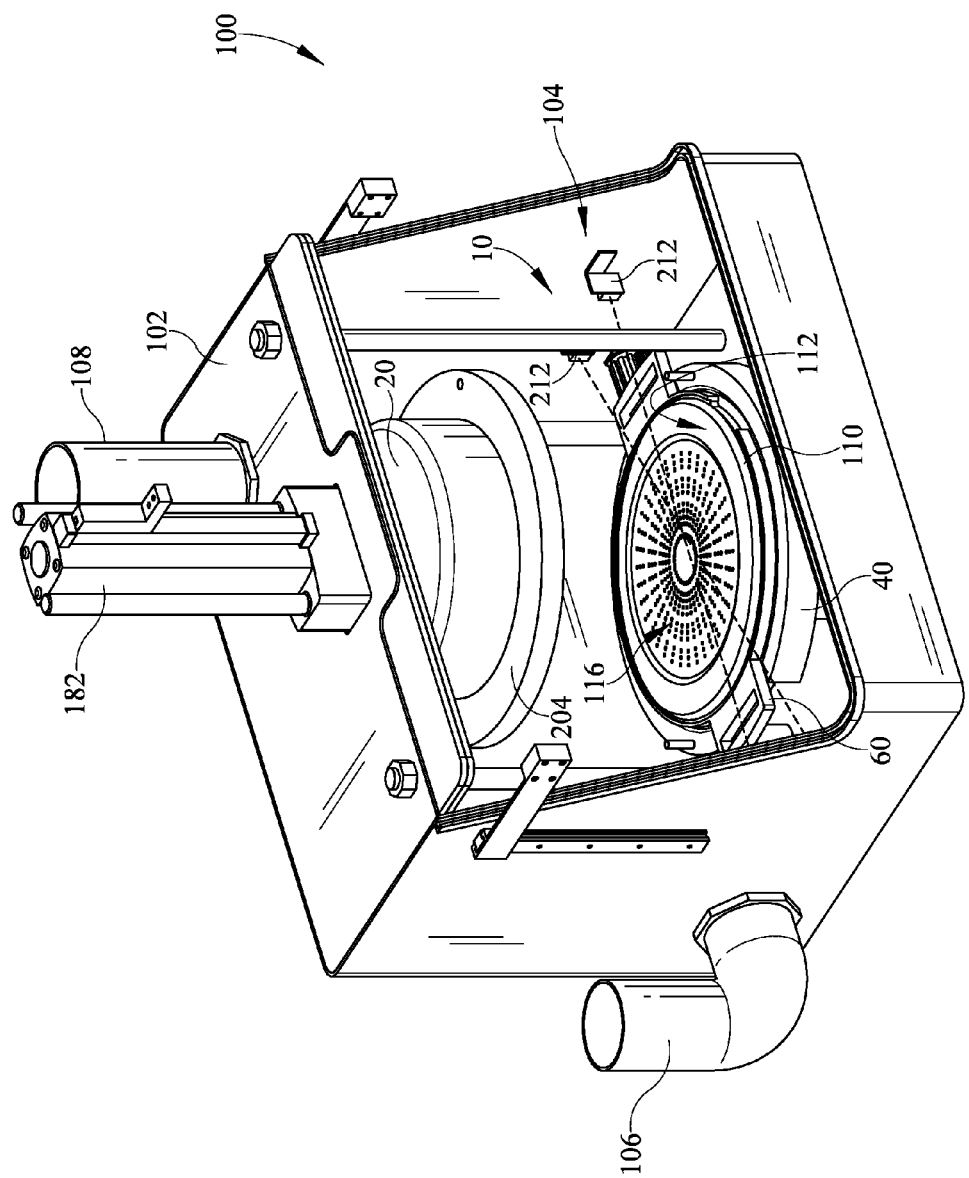
FIGS. 8-9 schematically depict a mixed acid cleaning assembly according to one or more embodiments shown and described herein.

Referring again to FIG. 1, the cleaning assembly 100 can comprise a vertical actuator 182 for applying force to the modular electrode sealing housing 10 substantially along the Y-axis. Specifically, the vertical actuator 182 comprises a translation member 184 that is coupled to a mounting member 186. The mounting member 186 can be coupled to high pressure closure member 20 of the modular electrode sealing housing 10. The vertical actuator 182 can be operable to transition the high pressure closure member 20 between a closed position (FIG. 1) and an open position (FIG. 8). In some embodiments, the vertical actuator 182 is configured to translate the modular electrode sealing housing 10, and not to provide any clamping pressure to the modular electrode sealing housing 10. Alternatively or additionally, the vertical actuator 182 can be configured to providing clamping pressure to seal the modular electrode sealing housing 10 in the closed position. For example, the vertical actuator 182 can displace the high pressure closure member 20 and compress O-rings 188 (FIG. 2). It is noted that, while the vertical actuator 182 is depicted as being operable to translate the high pressure closure member 20, the vertical actuator 182 can be operable to cause any type of relative translation between the high pressure closure member 20 and the low pressure closure member 40 such as, but not limited to, translating the low pressure closure member 40. As used herein, the term "actuator" means a servomechanism that supplies and transmits a measured amount of energy for the operation of another mechanism such as, for example, a pneumatic servomechanism, an electrical servomechanism, and the like.

Figure 9A:
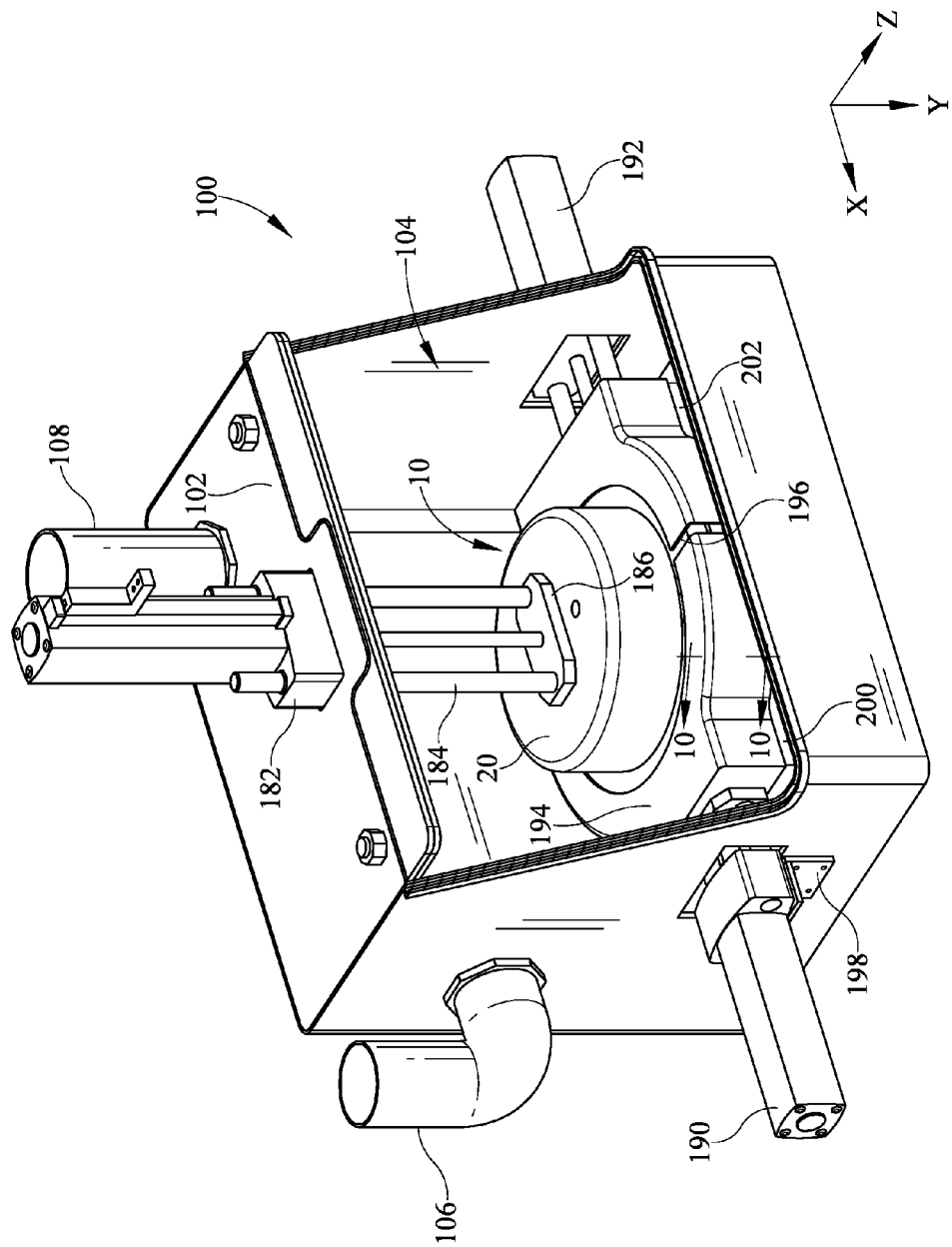

Referring now to FIG. 9A, an alternative embodiment for providing clamping pressure to seal the modular electrode sealing housing 10 is depicted. In some embodiments, the cleaning assembly 100 can comprise a first horizontal actuator 190 and a second horizontal actuator 192 that translate substantially along the X-axis to seal the modular electrode sealing housing 10. The first horizontal actuator 190 is coupled to a first clamping fork 194 such that the first horizontal actuator 190 is operable to move the first clamping fork 194 substantially along the X-axis. The second horizontal actuator 192 is coupled to a second clamping fork 196 such that the second horizontal actuator 192 is operable to move the second clamping fork 196 along the X-axis. The first horizontal actuator 190 and the second horizontal actuator 192 can cooperate to translate the first clamping fork 194 and the second clamping fork 196 from a closed position (FIG. 9A) to an open position (FIG. 9B) and from the open position to the closed position. Accordingly, the first clamping fork 194 and the second clamping fork 196 may selectively apply clamping force to the modular electrode sealing housing 10.

The sealable chamber 102 can be coupled to the first horizontal actuator 190 and the second horizontal actuator 192. In some embodiments, a support bracket 198 can be utilized to couple the first horizontal actuator 190 to the sealable chamber 102. Similarly, a support bracket 198 (not visible in FIG. 9A) can be utilized to couple the second horizontal actuator 192 to the sealable chamber 102. In some embodiments, a left guide block 200 and a right guide block 202 can be provided to support and align the first horizontal actuator 190 and the second horizontal actuator 192 along one or more X-Z planes.

Figure 9B:
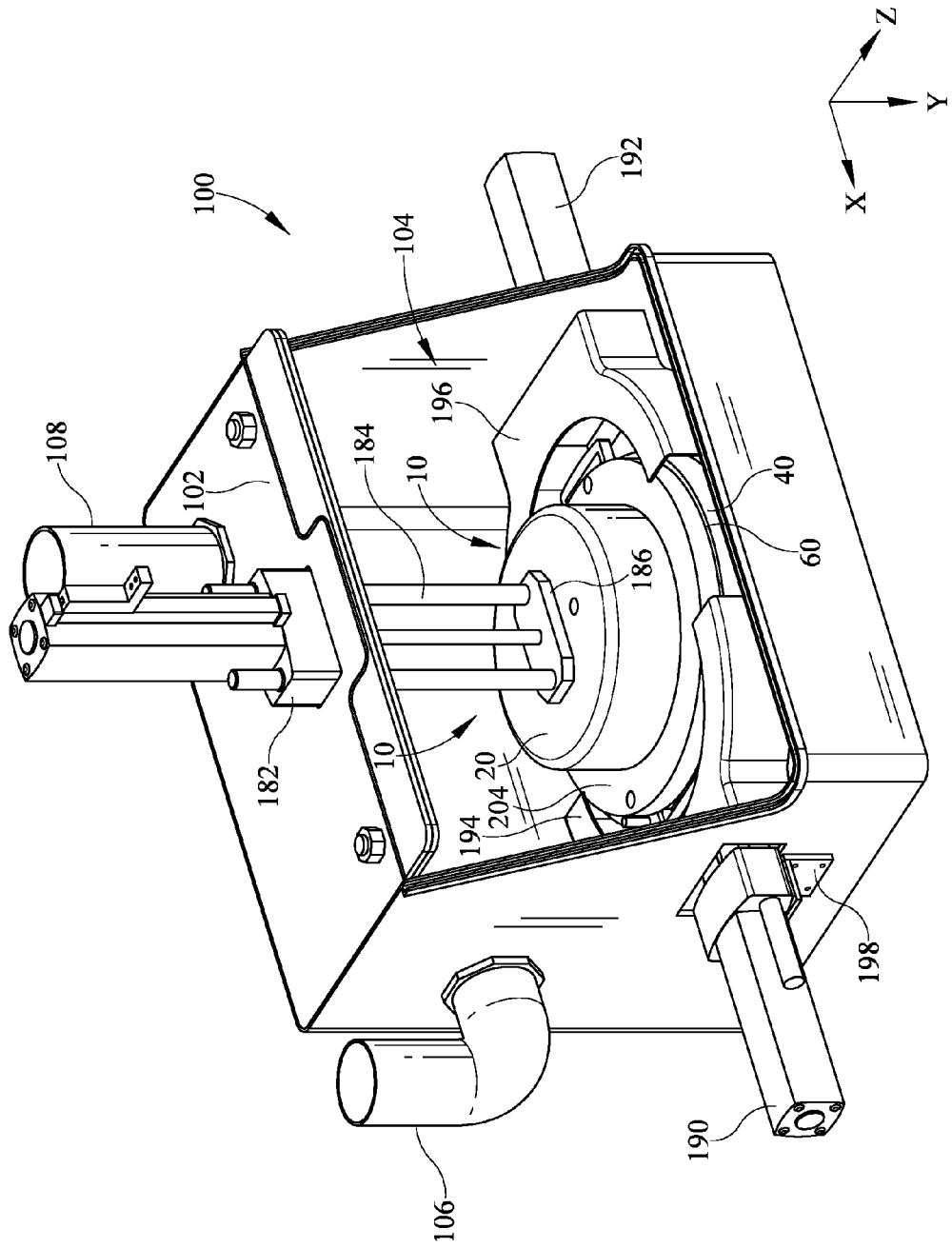
Figure 10:
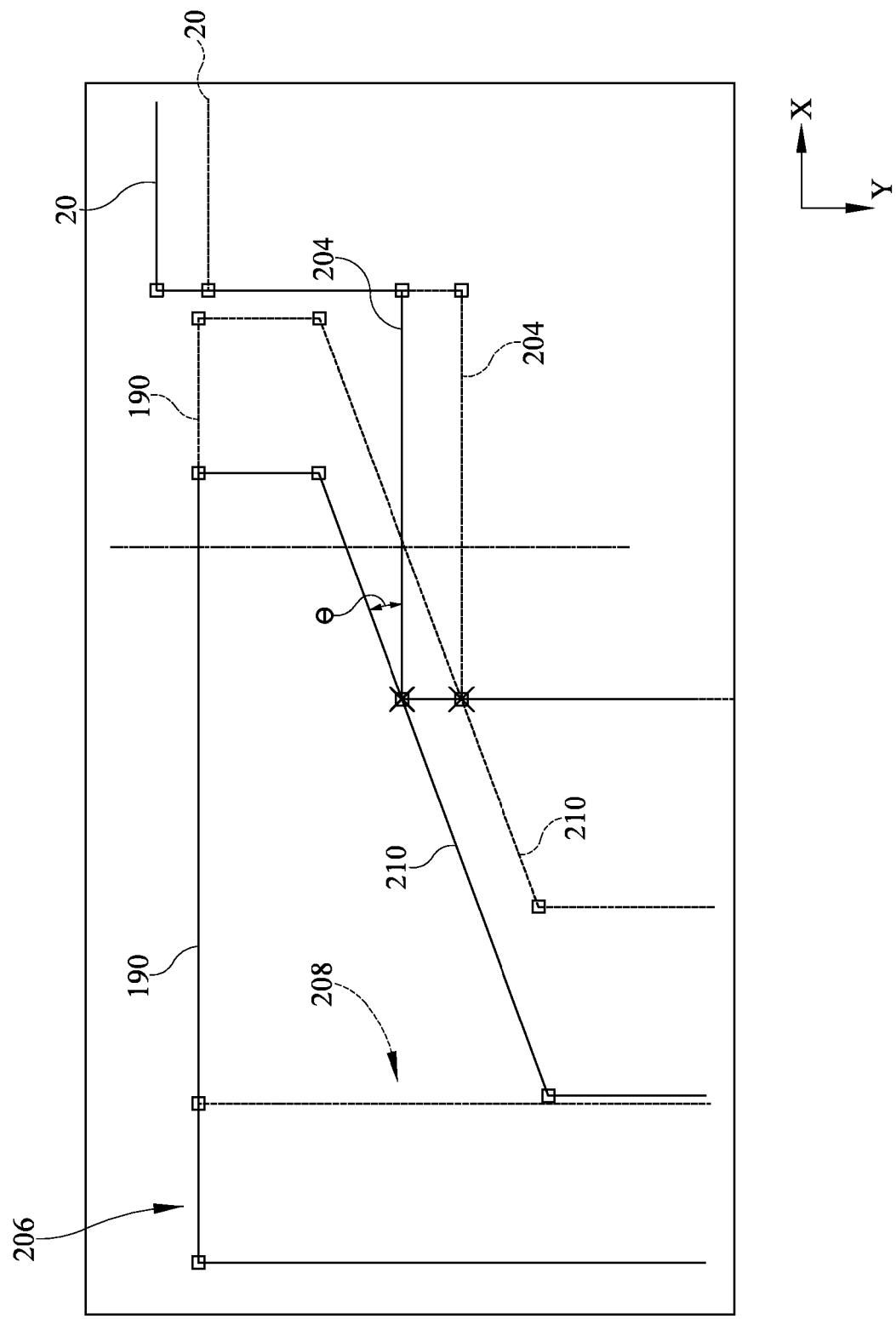
FIG. 10 schematically depict a cross section view of a clamping fork and a flange member of a mixed acid cleaning assembly according to one or more embodiments shown and described herein.

Referring now to FIG. 10, the first clamping fork 194 can be contoured in a complimentary shape with respect to the modular electrode sealing housing 10. In one embodiment, the first clamping fork 194 is contoured to receive a flange member 204 of the high pressure closure member 20 and apply increasing clamping force upon the modular electrode sealing housing 10 as the first clamping fork 194 is moved from an initial contact position 206 to an inward position 208 with respect to the flange member 204 of the high pressure closure member 20. Specifically, the first clamping fork 194 can comprise a flange engaging surface 210 is canted such that when the first clamping fork 194 makes initial contact with the high pressure closure member 20, the initial contact position 206, flange engaging surface 210 is oriented at an engagement angle θ with respect to the flange member 204. In some embodiments, the engagement angle θ is less than about 45° (about 0.79 radians), such as, for example, about 20° (about 0.35 radians) in one embodiment. Additionally, the second clamping fork 196 can be contoured to receive a flange member 204 is a manner substantially equivalent to the first clamping fork 194, as is described above. It is noted that, while two clamping forks are depicted in FIGS. 9A and 9B, any number of clamping forks can be utilized such that substantially uniform clamping force is applied across the flange member 204 of the high pressure closure member 20.

Referring collectively to FIGS. 1 and 8, the cleaning assembly 100 can comprise one or more positional sensors 212 configured to detect the relative positioning of the high pressure closure member 20 and the low pressure closure member 40 of the modular electrode sealing housing 10 with respect to one another. In one embodiment, the one or more positional sensors 212 can be configured to detect the position of the high pressure closure member 20 substantially along the Y-axis. The position of the high pressure closure member 20 can be correlated, automatically with the processor 185 (FIG. 4), to the amount of clamping force that is applied to urge the high pressure closure member 20 and the low pressure closure member 40 of the modular electrode sealing housing 10 together. It is noted that the term "sensor," as used herein, means a device that measures a physical quantity and converts it into a data signal, which is correlated to the measured value of the physical quantity, such as, for example, an electrical signal, an electromagnetic signal, an optical signal, a mechanical signal, or the like. Accordingly, the one or more positional sensors 212 can include optical sensors such as, for example, fork light barriers or trough beam sensors, or any other sensor capable to detecting relative positioning of the high pressure closure member 20 and the low pressure closure member 40 of the modular electrode sealing housing 10.

According to the embodiments described herein, each of the solenoid valve 140, solenoid valve 158, solenoid valve 165, pressure exhaust 178, and solenoid valve 183 can be communicatively coupled to one or more processors 185 (generally indicated in FIG. 4 as dashed arrows). Accordingly, operation of the cleaning assembly 100 can be automatically controlled by the execution of machine readable instructions by the one or more processors 185. As used herein, the term "communicatively coupled" means that the components are capable of exchanging data signals with one another such as, for example, electrical signals via conductive medium, electromagnetic signals via air, optical signals via optical waveguides, and the like.

The processor 185 can be any device capable of executing machine readable instructions. Accordingly, the processor 185 may be a controller, an integrated circuit, a microchip, a computer, or any other computing device. Moreover, the processor can be communicatively coupled to a memory such as, for example, RAM, ROM, a flash memory, a hard drive, or any device capable of storing machine readable instructions.

As is explained in further detail herein, the processor 185 can cause any process to be performed automatically by executing machine readable instructions or an algorithm written in any programming language of any generation (e.g., 1GL, 2GL, 3GL, 4GL, or 5GL) such as, e.g., machine language that may be directly executed by the processor, or assembly language, object-oriented programming (OOP), scripting languages, microcode, etc., that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components.

Referring again to FIG. 2, the modular electrode sealing housing 10 can be disposed within the sealable chamber 102 such that the modular electrode sealing housing 10 is exposed to the ambient conditions within the interior volume 104. As is noted above, the interior volume 104 can be supplied with clean air via the air inlet 106 and evacuated of by-products of the modular electrode sealing housing 10 via the air outlet 108.

The modular electrode sealing housing 10 can comprise a high pressure closure member 20, a low pressure closure member 40, and an electrode carrier plate 60 that are sealed to a showerhead electrode 110 via multiple o-rings 188. Specifically, the high pressure closure member 20 can be sealed to a first side 112 of the showerhead electrode with an o-ring 188. Together the high pressure closure member 20 and the first side 112 of the showerhead electrode 110 can define a first cleaning volume 22. The high pressure closure member 20 can contain a first cleaning volume 22 one the first side 112 of the showerhead electrode 110. The low pressure closure member 40 can be sealed to the electrode carrier plate 60 with an o-ring 188. The electrode carrier plate 60 can be sealed to a second side 114 of the showerhead electrode 110 with an o-ring 188. Together the low pressure closure member 40, the electrode carrier plate 60, and the second side 114 of the showerhead electrode 110 can define a second cleaning volume 42. The low pressure closure member 40 can contain the second cleaning volume 42 on the second side 114 of the showerhead electrode 110.

The modular electrode sealing housing 10 can optionally comprise a fluid diffuser 90 for diffusing fluid supplied to the first cleaning volume 22. For example, the fluid diffuser 90 can be coupled to the overlap defining wall 34 of the high pressure closure member 20 such that the fluid diffuser 90 demarcates the first section 26 of the first cleaning volume 22 and the second section 28 of the first cleaning volume 22. The fluid diffuser can comprise a turbulent facing surface 92 exposed to the first section 26 of the first cleaning volume 22, an isostatic facing surface 94 exposed to the second section 28 of the first cleaning volume 22 and a plurality of diffusing flow-paths 96 between the turbulent facing surface 92 and the isostatic facing surface 94. Thus, pressurized fluid introduced to the first section 26 of the first cleaning volume 22 flows through the diffusing flow-paths 96 and into the second section 28 of the first cleaning volume 22.

In one embodiment, an acid injection inlet 120, a gas injection inlet 150, and a second fluid injection inlet 166 can be formed though the depth defining wall 24 of the high pressure closure member 20. The gas injection inlet 150 can be in fluid communication with a gas dispersion member 152 for supplying purified air to the first cleaning volume 22. The second fluid injection inlet 166 can be in fluid communication with a liquid dispersion member 168 for supplying purified water to the first cleaning volume 22.

In some embodiments, the acid injection inlet 120, the gas outlets 160 of the gas dispersion member 152, and the liquid outlets 172 of the liquid dispersion member 168 can be out of alignment with each of the plurality of diffusing flow-paths 96 of the fluid diffuser 90. Specifically, the acid injection inlet 120 can be out of direct alignment with each of the plurality of diffusing flow-paths 96. Accordingly, substantially all of an acidic solution supplied via the acid injection inlet 120 redirected within the first section 26 of the first cleaning volume 22 before traveling through the plurality of diffusing flow-paths 96. The gas outlets 160 of the gas dispersion member 152 can be directed towards the depth defining wall 24 of the high pressure closure member 20. Accordingly, substantially all of a pressurized gas supplied via the gas dispersion member 152 can be redirected within the first section 26 of the first cleaning volume 22 by the depth defining wall 24 before traveling through the plurality of diffusing flow-paths 96. The liquid outlets 172 of the liquid dispersion member 168 can be directed towards the first outer wall 30 of the high pressure closure member 20. Accordingly, substantially all of the purified water supplied via the liquid dispersion member 168 can be redirected within the first section 26 of the first cleaning volume 22 by the first outer wall 30 before traveling through the plurality of diffusing flow-paths 96. Therefore, without being bound to any particular theory, it is believed that any of the acidic solution, pressurized gas, and purified water exits the second section 28 of the first cleaning volume 22 contained by the high pressure closure member 20 in a substantially isostatic manner. Specifically, it is believed that a substantially constant pressure is applied to the first side 112 of the showerhead electrode 110 substantially along an X-Z plane.

Referring collectively to FIGS. 2 and 3, the low pressure closure member 40 and the electrode carrier plate 60 can cooperate to support the showerhead electrode 110. In one embodiment, the upper support surface 52 of the low pressure closure member 40 can be engaged with the underside 78 of the electrode carrier plate 60. Specifically, the peripheral electrode contacting portion 62 of the electrode carrier plate 60 can be aligned with and supported substantially along the Y-axis by the peripheral support region 44 of the low pressure closure member 40. The horizontal support members 64 of the electrode carrier plate 60 can be aligned with and supported substantially along the Y-axis by the protruding support members 48 of the low pressure closure member 40.

The low pressure closure member 40 can further comprise an outer alignment rim 54 that substantially surrounds the peripheral support region 44. The outer alignment rim 54 can project away from the peripheral support region 44 substantially in the negative Y-direction. The outer alignment rim 54 of the low pressure closure member 40 can be configured to accept the electrode carrier plate 60. Accordingly, when the upper support surface 52 of the low pressure closure member 40 can be engaged with the underside 78 of the electrode carrier plate 60, the outer alignment rim 54 limits the lateral movement (e.g., movement about the X-Z plane) of the electrode carrier plate 60. In some embodiments, the electrode carrier plate 60 can comprise one or more handles 82 and the outer alignment rim 54 may include cutout regions 58 for receiving the one or more handles 82.

The electrode carrier plate 60 can be engaged with the second side 114 of the showerhead electrode 110 such that substantially all of the gas passages 116 are uncovered. Specifically, the portions of the second side 114 of the showerhead electrode 110 adjacent to the gas passages 116 can be in contact with the annular electrode contacting ridge 66 and the arcuate electrode contacting ridges 70 of the electrode carrier plate 60. The outer portion 118 of the showerhead electrode 110 can be in contact with the peripheral electrode contacting portion 62 of the electrode carrier plate 60. The gas passages 116 of the showerhead electrode 110 can be aligned with the cut-out regions 74 of the electrode carrier plate 60 and the relief formed by the one or more horizontal support members 64 and the arcuate electrode contacting ridges 70 of the electrode carrier plate 60. Accordingly, the electrode carrier plate 60 can support the showerhead electrode 110 substantially along the Y-axis without stopping fluids from flowing through the gas passages 116 from the first side 112 to the second side 114 of the showerhead electrode 110.

The electrode carrier plate 60 can further comprise an electrode alignment rim 80 that substantially surrounds the peripheral electrode contacting portion 62. The electrode alignment rim 80 can project away from the support surface 68 substantially in the negative Y-direction. The electrode alignment rim 80 of the electrode carrier plate 60 can be configured to align the showerhead electrode with the modular electrode sealing housing 10. Accordingly, when the support surface 68 of electrode carrier plate 60 is engaged with the second side 114 of the showerhead electrode 110, the electrode alignment rim 80 limits the lateral movement (e.g., movement about the X-Z plane) of the showerhead electrode 110.

Moreover, when engaged with one another, the low pressure closure member 40, electrode carrier plate 60 and the showerhead electrode 110 can demarcate the second cleaning volume 42 on the second side 114 of the showerhead electrode 110. In the depicted embodiment, the low pressure closure member 40 can contain the lowest portion (portion furthest along the positive Y-direction) of the second cleaning volume 42. As is noted above, one or more conoidal spray members 142 can be in fluid communication with a second fluid injection inlet 166 formed through the fluid collecting surface 46 of the low pressure closure member 40. Each of the one or more conoidal spray members 142 can be aligned with cut-out regions 74 of the electrode carrier plate 60 substantially along the Y-axis. Accordingly, purified water can be injected through the second cleaning volume 42 and into contact with the second side 114 of the showerhead electrode 110.

In order that the embodiments described herein may be more readily understood, reference is made to the following example, which is intended to illustrate the embodiments described herein, but not limit the scope thereof.

Figure 11:
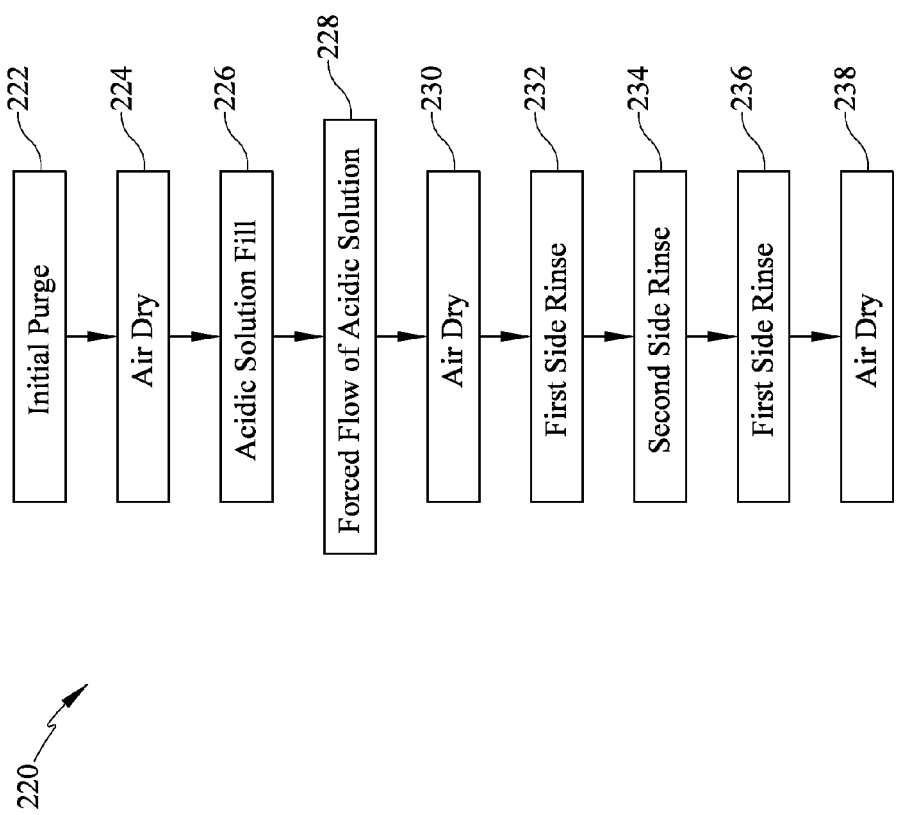
FIG. 11 schematically depicts a method for mixed acid cleaning according to one or more embodiments shown and described herein.

A method 220 for determining a predetermined path is depicted in FIG. 11. Each process of the method 220 can be performed automatically with the one or more processors 185 (FIG. 4). Specifically, it is noted that while the processes are described as being performed according to a specific sequence, it is noted that each of the processes described herein can be performed in any order. Moreover, multiple processes can be performed simultaneously and/or eliminated.

Referring collectively to FIGS. 2 and 11, a showerhead electrode 110 can be sealed within a cleaning assembly 100, as is described hereinabove. Generally, the showerhead electrode 110 comprises a plurality of gas passages 116 that extend through the showerhead electrode 110 from the first side 112 of the showerhead electrode 110 to the second side 114 of the showerhead electrode 110. At process 222, a quantity of purified water can be propelled through the first cleaning volume 22 on the first side 112 of the showerhead electrode 110 and into contact with the first side 112 of the showerhead electrode 110. Accordingly, the purified water can be forced to travel through the plurality of gas passages 116 of the showerhead electrode 110. For example, purified water can be injected into the first cleaning volume 22 by the liquid dispersion member 168. In some embodiments, it may be desirable to perform process 222 as an initial purge before an acidic solution is loaded into the first cleaning volume 22. Accordingly, the first cleaning volume 22, and the second cleaning volume 42 can be purged with purified water for a period of time such as, for example, about 5 seconds prior to cleaning the showerhead electrode 110.

At process 224, an amount of air can be injected injecting into the first cleaning volume 22 on the first side 112 of the showerhead electrode 110. For example, the gas dispersion member 152 can supply pressurized air to the first cleaning volume 22 such that the pressure in the first cleaning volume 22 is relatively high compared to the pressure of the second cleaning volume 42. Accordingly, any purified water in the first cleaning volume 22 and the gas passages 116 of the showerhead electrode 110 can be forced into the second cleaning volume 42. The purified water can then be collected by the fluid collecting surface 46 of the low pressure closure member 40 and drained from the cleaning assembly 100 via the outlet passage 50. For example, when the Y-axis is substantially aligned with gravity, the purified water can be drained via the outlet passage under the urging of gravity. In some embodiments, it may be desirable to perform process 224 after process 222 to dry the showerhead electrode 110 before the acidic solution is loaded into the first cleaning volume 22.

At process 226, the acidic solution can be loaded into the first cleaning volume 22 on the first side 112 of the showerhead electrode 110. For example, the acid injection inlet 120 can supply the acidic solution to the first cleaning volume 22. It is noted that because the acidic solution is generally pumped (e.g., via the pump 126 depicted in FIG. 4) the pressure in the first cleaning volume 22 can relatively high compared to the pressure of the second cleaning volume 42. Moreover, a chemical reaction between the acidic solution and the showerhead electrode 110 can occur during process 226. The chemical reaction can be exothermic and produce gases, which can also increase the pressure in the first cleaning volume 22. Accordingly, the first cleaning volume 22 can be vented, while the acidic solution is loaded. Specifically, the pressure exhaust 178 can be opened automatically, i.e., either upon direction of the one or more processors 185 (FIG. 4) or due to an over pressure actuation.

At process 228, after the first cleaning volume has been supplied with the acidic solution, the first cleaning volume 22 can be pressurized such that at least a portion of the acidic solution flows through one or more of the plurality of gas passages 116 of the showerhead electrode 110. In one embodiment, the gas dispersion member 152 can supply pressurized air to the first cleaning volume 22 such that the pressure in the first cleaning volume 22 is relatively high compared to the pressure of the second cleaning volume 42. Accordingly, acidic solution in the first cleaning volume 22 can be urged through the gas passages 116 of the showerhead electrode 110 and forced into the second cleaning volume 42. In some embodiments, the flow of substantially all of the acidic solution can take about 5 seconds.

At process 230, pressurized air can be supplied to the first cleaning volume 22 to dry the showerhead electrode 110. For example, the gas dispersion member 152 can continue to inject air into the first cleaning volume 22 after the flow of the acidic solution has subsided, in order to ensure that the showerhead electrode 110 is dry. In some embodiments, the showerhead electrode 110 can be dried for about twice as long as the acidic solution is forced to flow in process 228.

At process 232, a quantity of purified water can be propelled through the first cleaning volume 22 and into contact with the first side 112 of the showerhead electrode 110. Accordingly, the purified water can be forced to travel through the plurality of gas passages 116 of the showerhead electrode 110. For example, the quantity of purified water can be injected into the first cleaning volume 22 by the liquid dispersion member 168. In some embodiments, the quantity of purified water can be supplied continuously for about 5 seconds.

At process 234, an amount of purified water can be propelled through the second cleaning volume 42 on the second side 114 of the showerhead electrode 110, and into contact with the second side 114 of the showerhead electrode 110. For example, the purified water can be propelled towards the second side 114 of the showerhead electrode 110 by the conoidal spray members 142. In some embodiments, the conoidal spray members 142 can supply purified water to the showerhead electrode 110 for about 5 seconds.

At process 236, a second quantity of purified water can be propelled through the first cleaning volume 22 and into contact with the first side 112 of the showerhead electrode 110. For example, the quantity of purified water can be injected into the first cleaning volume 22 by the liquid dispersion member 168 after the conoidal spray members 142 has supplied the purified water that contacts the second side 114 of the showerhead electrode 110.

At process 238, an amount of air can be injected into the first cleaning volume 22. In one embodiment, after the first side 112 of the showerhead electrode 110 has been rinsed with purified water twice and the second side has been rinsed with purified water, the gas dispersion member 152 can supply pressurized air to the first cleaning volume 22 such that the pressure in the first cleaning volume 22 is relatively high compared to the pressure of the second cleaning volume 42. Accordingly, any purified water in the first cleaning volume 22 and the gas passages 116 of the showerhead electrode 110 can be forced into the second cleaning volume 42.

The method 220 can be automated utilizing the cleaning assembly 100 depicted in FIG. 4. For example, the one or more processors 185 can execute machine readable instructions to open and close the various solenoid valves as shown below in Table 1 during each of the above described processes.

ticular aspects of an embodiment of the present disclosure or to emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

Furthermore, it is noted that directional references such as, for example, flow path, X-direction, Y-direction, X-axis, Y-axis, X-Z plane and the like have been provided for clarity and without limitation. Specifically, it is noted such directional references are made with respect to the coordinate systems depicted in FIGS. 1-10. Thus, the directions may be reversed or oriented in any direction by making corresponding changes to the provided coordinate system with respect to the structure to extend the examples described herein.

Having described the invention in detail and by reference to specific embodiments thereof, it will be apparent that modifications and variations are possible without departing from the scope of the invention defined in the appended claims.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method for cleaning a showerhead electrode, comprising:
    sealing a showerhead electrode within a cleaning assembly such that a first cleaning volume is formed on a first side of the showerhead electrode within a high pressure closure member sealed to the showerhead electrode and a second cleaning volume is formed on a second side of the showerhead electrode within a low pressure closure member sealed to the showerhead electrode, wherein the

TABLE 1

|  | Solenoid valve 128 | Solenoid valve 165 | Solenoid valve 183 | Solenoid valve 158 | Pressure exhaust 178 | Solenoid Valve 140 |
| --- | --- | --- | --- | --- | --- | --- |
| Process 222 | Closed | Closed | Open | Closed | Closed | Closed |
| Process 224 | Closed | Open | Open | Open | Closed | Closed |
| Process 226 | Open | Closed | Closed | Closed | Open | Closed |
| Process 228 | Closed | Closed | Open | Open | Closed | Closed |
| Process 230 | Closed | Closed | Open | Open | Closed | Closed |
| Process 232 | Closed | Open | Open | Closed | Closed | Closed |
| Process 234 | Closed | Closed | Open | Closed | Closed | Open |
| Process 236 | Closed | Open | Open | Closed | Closed | Closed |
| Process 238 | Closed | Closed | Open | Open | Closed | Closed |

For the purposes of describing and defining the present invention it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

It is noted that the term "commonly," when utilized herein, is not utilized to limit the scope of the claimed invention or to imply that certain features are critical, essential, or even important to the structure or function of the claimed invention. Rather, these terms are merely intended to identify parshowerhead electrode comprises a plurality of gas passages that extend through the showerhead electrode from the first side of the showerhead electrode to the second side of the showerhead electrode;

loading an acidic solution into the first cleaning volume on the first side of the showerhead electrode;

after the loading, pressurizing the first cleaning volume on the first side of the showerhead electrode such that at least a portion of the acidic solution flows through one or more of the plurality of gas passages of the showerhead electrode; and propelling an amount of purified water through a fluid injection inlet coupled to the low pressure closure member and in fluid communication with the second cleaning volume on the second side of the showerhead electrode, and into contact with the second side of the showerhead electrode.

2. The method of claim 1, further comprising venting the first cleaning volume on the first side of the showerhead electrode, while the acidic solution is loaded.

3. The method of claim 1, further comprising propelling a quantity of purified water through the first cleaning volume on the first side of the showerhead electrode and into contact with the first side of the showerhead electrode before the amount of purified water is propelled into contact with the second side of the showerhead electrode.

4. The method of claim 3, further comprising propelling a second quantity of purified water through the first cleaning volume on the first side of the showerhead electrode and into contact with the first side of the showerhead electrode after the amount of purified water contacts the second side of the showerhead electrode.

5. The method of claim 4, injecting an amount of air into the first cleaning volume on the first side of the showerhead electrode after the second quantity of purified water contacts the first side of the showerhead electrode, wherein at least a portion of the amount of air is forced through one or more of the plurality of gas passages of the showerhead electrode.

6. The method of claim 3, wherein the quantity of purified water is propelled by a liquid dispersion member comprising a cylindrical body with a central flow path formed therein, and a plurality of liquid outlets formed in the cylindrical body, wherein each of the plurality of liquid outlets is a substantially linear conduit that travels radially outward from the central flow path.

7. The method of claim 1, further comprising propelling a quantity of purified water through the first cleaning volume on the first side of the showerhead electrode and into contact with the first side of the showerhead electrode before the acidic solution is loaded into the first cleaning volume.

8. The method of claim 7, injecting an amount of air into the first cleaning volume on the first side of the showerhead electrode after the quantity of purified water contacts the first side of the showerhead electrode and before the acidic solution is loaded into the first cleaning volume.

9. The method of claim 1, wherein the cleaning assembly is sealed to the showerhead electrode via one or more O-rings, the low pressure closure member further including a spray member in fluid communication with the fluid injection inlet which sprays the purified water in the second cleaning volume, and the low pressure closure member including an outlet passage in fluid communication with the second cleaning volume through which the purified water from the second cleaning volume is drained during cleaning of the showerhead electrode.

10. The method of claim 9, wherein the high pressure closure member has a flange member and a horizontal actuator coupled to a clamping fork that is contoured to receive the flange member of the high pressure closure member, and wherein the horizontal actuator translates the clamping fork laterally into contact with the flange member to provide a clamping pressure to compress the one or more O-rings.

11. The method of claim 9, wherein the cleaning assembly comprises a vertical actuator provides a clamping pressure to compress the one or more O-rings.

12. The method of claim 1, wherein the cleaning assembly comprises an outlet passage in fluid communication with the second cleaning volume on the second side of the showerhead electrode, the method further comprising maintaining the outlet passage closed while the acidic solution is loaded into the first cleaning volume on the first side of the showerhead electrode and maintaining the outlet passage open while the first cleaning volume on the first side of the showerhead electrode is pressurized.

13. The method of claim 1, wherein the cleaning assembly comprises a plurality of arcuate electrode contacting ridges that are in contact with the second side of the showerhead electrode such that the plurality of gas passages of the showerhead electrode are unobstructed.

14. The method of claim 1, wherein the acidic solution comprises nitric acid.

15. The method of claim 1, wherein the acidic solution comprises hydrofluoric acid.

16. The method of claim 1, wherein the acidic solution comprises acetic acid.

17. The method of claim 1, wherein the acidic solution is a mixed acid solution comprising nitric acid, hydrofluoric acid, and acetic acid at a volume ratio of about 6 to about 1 to about 1.

18. The method of claim 1, wherein the first cleaning volume on the first side of the showerhead electrode is pressurized with a gas supplied with a gas dispersion member comprising a chamfered body having a substantially trapezoidally shaped cross-section and a plurality of gas outlets formed in the chamfered body.

19. The method of claim 1, wherein the amount of purified water is propelled through the second cleaning volume on the second side of the showerhead electrode with a conoidal spray member comprising a cone shaped member having a base that tapers toward a peak of the cone shaped member, and a plurality of apertures formed through the cone shaped member and arranged in a plurality of concentric rings.

20. A method for cleaning a showerhead electrode, comprising:
    sealing a showerhead electrode within a cleaning assembly such that a first cleaning volume is formed on a first side of the showerhead electrode within a high pressure closure member sealed to the showerhead electrode and a second cleaning volume is formed on a second side of the showerhead electrode within a low pressure closure member sealed to the showerhead electrode, wherein the showerhead electrode comprises a plurality of gas passages that extend through the showerhead electrode from the first side of the showerhead electrode to the second side of the showerhead electrode;
    loading an acidic solution into the first cleaning volume on the first side of the showerhead electrode;
    after the loading, pressurizing the first cleaning volume on the first side of the showerhead electrode a gas supplied with a gas dispersion member, such that at least a portion of the acidic solution flows through one or more of the plurality of gas passages of the showerhead electrode, wherein the gas dispersion member comprises a chamfered body having a substantially trapezoidally shaped cross-section and a plurality of gas outlets formed in the chamfered body;
    propelling a quantity of purified water through the first cleaning volume on the first side of the showerhead electrode and into contact with the first side of the showerhead electrode with a liquid dispersion member comprising a cylindrical body with a central flow path formed therein, and a plurality of liquid outlets formed in the cylindrical body, wherein each of the plurality of liquid outlets is a substantially linear conduit that travels radially outward from the central flow path; and
    propelling an amount of purified water through a conoidal spray member coupled to the low pressure closure member and in fluid communication with the second cleaning volume on the second side of the showerhead electrode, and into contact with the second side of the showerhead electrode, the conoidal spray member comprising a cone shaped member having a base that tapers toward a peak of the cone shaped member, and a plurality of apertures formed through the cone shaped member and arranged in a plurality of concentric rings.

* * * * *